US006869641B2

(12) United States Patent
Schmitt

(10) Patent No.: US 6,869,641 B2
(45) Date of Patent: Mar. 22, 2005

(54) METHOD AND APPARATUS FOR ALD ON A ROTARY SUSCEPTOR

(75) Inventor: Jacques Schmitt, La Ville du Bois (FR)

(73) Assignee: Unaxis Balzers Ltd., Balzers (LI)

( * ) Notice: Subject to any disclaimer, the term of this patent is extended or adjusted under 35 U.S.C. 154(b) by 25 days.

(21) Appl. No.: 10/612,513

(22) Filed: Jul. 2, 2003

(65) Prior Publication Data

US 2004/0052972 A1 Mar. 18, 2004

Related U.S. Application Data

(60) Provisional application No. 60/394,086, filed on Jul. 3, 2002.

(51) Int. Cl.[7] .............................................. C23C 16/00
(52) U.S. Cl. ............................... 427/248.1; 427/255.5; 427/255.23; 427/569
(58) Field of Search .................... 427/248.1, 255.5, 427/255.23, 569

(56) References Cited

U.S. PATENT DOCUMENTS

| | | | | |
|---|---|---|---|---|
| 4,987,856 A | * | 1/1991 | Hey et al. | 118/723 E |
| 5,366,555 A | * | 11/1994 | Kelly | 118/719 |
| 2001/0007244 A1 | * | 7/2001 | Matsuse | 118/719 |
| 2003/0194493 A1 | * | 10/2003 | Chang et al. | 427/248.1 |

* cited by examiner

*Primary Examiner*—Timothy Meeks
(74) *Attorney, Agent, or Firm*—Pearne & Gordon LLP

(57) ABSTRACT

A chemical vapor deposition method and apparatus is disclosed. The process is carried out in an apparatus having a number reactive zones, each surrounded by a corresponding exhaust zone, all of which are both contained within a buffer zone. Pressure relationships are controlled such that buffer gas from the buffer zone flows into the exhaust zones and reactive gas from the reactive zones flow into the exhaust zones. As a result, cross-contamination of gases between the reactive zones is avoided.

23 Claims, 5 Drawing Sheets

METHOD AND APPARATUS FOR ALD ON A ROTARY SUSCEPTOR

RELATED APPLICATION DATA

This application claims the benefit of U.S. Provisional Patent Application No. 60/394,086 filed Jul. 3, 2002, which is incorporated by reference herein in its entirety.

FIELD OF THE INVENTION

The invention relates to a method and apparatus for atomic layer deposition (ALD) or epitaxy, in particular a method for performing ALD using a rotary susceptor apparatus.

BACKGROUND OF THE INVENTION

Atomic Layer Deposition (ALD) (also referred to as Atomic Layer Epitaxy, or ALE) is a Chemical Vapor Deposition (CVD) technique. Classical CVD is based on exposing a surface to a gas mixture. The surface is heated, and the heat induces a reaction and/or decomposition of the gases. This results in the formation of a solid film layer on the surface.

ALE is a species of ALD and refers to the growth of a crystalline film on the substrate surface, while ALD is more general and extends to the deposition of amorphous materials as well. In this specification the term ALD will be generally used, with the understanding that it includes ALE as well.

The principle of ALD is that the raw materials are two gases, which will be referred to as "a" and "b". The gases "a" and "b" are so mutually reactive that they cannot be present at the same time in a gas mixture, as they would spontaneously react, leading to self-ignition or formation of dust. To form the film, the substrate is alternately exposed to the two gases. Care is required to ensure that the first gas is adequately eliminated from the substrate environment before the second gas is introduced to the substrate environment. A fraction of the first gas is chemisorbed as a mono-layer on the substrate surface, and it is this chemisorbed fraction of the first gas that reacts with the second gas to form the growing layer on the surface. Given sufficient exposure time, the chemisorbed layer of gas "a" will fully react with gas "b" creating a complete monolayer of solid compound and gaseous by-products. By removing the second gas from the substrate environment, exposing the substrate to the first gas, and repeating the process, the film is grown by an increasing number of atomic layers. Note that during a chemical exposure, the gas reactivity can be boosted by plasma excitation.

In the past, two basic techniques have been used to separate the reactive gases in ALD. These are referred to as the space separation method and the time separation method.

In the space separation method, the substrate is physically moved from an environment or zone where gas "a" is present to another chemically decoupled environment or zone where gas "b" is present.

In the time separation method, the substrate remains in one chamber and is exposed in successive independent steps to gases "a" and "b". In between additions of the reactive gases, the substrate environment is evacuated by pumping and/or is flushed with a nonreactive gas.

The deposition rate obtained by ALD is low, with a typical rate of 0.1 angstroms/sec. or less. A process time of up to 30 minutes can be required to deposit a layer of 15 nm. As a result, ALD processes tend to have low production rates and tend not to be cost effective.

A major factor in the long cycle time for time separated ALD is the degassing step in which one reactant is removed from a reaction chamber prior to exposure to the second reactant. In this method, the degassing must remove the reactant gas from the reaction chamber environment, including the gas delivery subsystem. In contrast, when space separation is used, the degassing time is reduced, as degassing is limited to the substrate and the substrate holder or susceptor. For maximum efficiency in a space separated ALD process, quick and effective degassing of the substrate and holder must occur during the transfer of the substrate from zone "a" to zone "b".

Failure to effectively degas the reaction environment or remove the reactant gas "a" from the substrate prior to exposure to reactant gas "b" will result in unwanted gas phase reactions leading to non conformal deposition or to dust formation, as the mingling gases will produce freely floating particles of the material that is supposed to be deposited on the substrate.

Careful degassing in space or time separated ALD usually avoids dust formation in the reactive zone proximate to the substrate. However, in systems utilizing a single pump downstream of the reactive zone or zones, dust may form downstream toward the pump or in any system dead volume that is not well managed in terms of chemical inter-diffusion. Accumulation of dust, even downstream of the reaction zones, creates a risk for contamination of the substrates in the reactive zone or zones. While careful engineering and maintenance can avoid dust contamination of substrates, the interruptions for regular maintenance required to avoid dust contamination will further reduce the output and cost-effectiveness of the ALD process.

In addition, periodic maintenance is required to remove deposition film from the interior of reaction chambers used in time separation ALD methods. Because the walls of the chamber are also exposed to alternating reactive gasses, a layer of ALD film tends to form on the reactor chamber's walls. The rate of deposition can be reduced by lowering the temperature of the reactor chamber's walls, but this tends to also slow the rate of degassing, hence the ALD cycle rate, further reducing deposition rate efficiency. The need for this type of periodic maintenance is reduced in reactors based on space separation ALD. Because the chamber walls are not subjected to alternating exposure to reaction gasses "a" and "b", the chambers do not build up a layer of the deposition film. The substrate carrier will still be exposed to the alternating reactive gas environments, but cleaning of the substrate carrier entails much less downtime for the ALD apparatus than cleaning of reactor chambers.

One approach to space separation has been the use of a susceptor in the form of a turntable which carries a substrate through a number of different and non-compatible chemical environments. This approach has been used when the gases in the non-compatible chemical environments are moderately reactive. ALD processes for use in semiconductor integrated circuit manufacturing, however, will require the use of gases which are strongly mutually reactive in order to create deposited layers meeting required standards of thickness control and conformality. Currently available turntable designs are unsatisfactory for use with such highly reactive gases.

FIG. 1 shows a prior art turntable apparatus. The apparatus 9 contains two reactive enclosures 24 and 34 contained in an outer enclosure 11. Reactive gas inlets 20 and 30 supply reactive gasses to reaction zones 2 and 3 in reactive enclosures 24 and 34, respectively. Although not indicated in the drawing, at least one of the zones 2 and 3 may also comprise plasma excitation by any of the known means. A turntable 7 is rotatable on a support arm 60. The substrates 8 rest on the turntable and so are alternately transported through the reactive enclosures 24 and 34. A neutral gas inlet 40 supplies gas to a buffer zone 6, which surrounds the reactive enclosures 24 and 34. During the CVD process the rotation of the turntable exposes the substrates 8 successively to the reactive gases in the reaction zones 2 and 3, building up a CVD film. The pressure of the reactive gasses in the reaction zones 2 and 3 is kept higher than the pressure of the neutral gas in the buffer zone 6. During the process, reactive gas in the reactive zone 2 escapes the reaction enclosure 24 through conductance slits or gaps 21 into the buffer zone 6. At the same time, reactive gas in the reactive zone 3 escapes the reaction enclosure 34 through conductance slits or gaps 31 into the buffer zone 6. The neutral gas and reactive gases in the buffer zone 1 are vented through the pipe 5 toward a common pump 4. The aim of this design is to create a dynamic gas flow running outward at the periphery of the reactive zones which prevents the contaminated gas from the buffer zone 1 from backstreaming into the reactive zones. In this design, however, both excess reactive gases "a" and "b" end up in the buffer zone where they will generate some film and some dust. Because the buffer zone is flushed with neutral gas, the build up of film and dust will take time. However, in the long run, such a system will have a contamination problem, in particular when using highly mutually reactive gases for conformal ALD growth. Thus, this design is adequate for protecting the chemical purity in the reactive zones, but is inadequate for preventing dust contamination of the system.

It would be desirable to have an ALD apparatus for use in space separation ALD that would allow the use of highly mutually reactive gasses and that would minimize the formation of dust downstream of the reaction chambers.

BRIEF SUMMARY OF THE INVENTION

A method of depositing an ALD film on a substrate is provided. The substrate is passed through a reactive zone containing reactive gas. The reactive zone is in fluid communication with an exhaust zone, which is also in communication with surrounding a buffer zone containing a neutral gas. The gas pressure in the buffer zone is higher than the gas pressure in the exhaust zone and is greater than or equal to the gas pressure in the reactive zone. The gas pressure in the reactive zone is also higher than the pressure in the exhaust zone. The substrate is then passed though a second reactive zone in fluid communication with a second exhaust zone. The gas pressure in the buffer zone is higher than the gas pressure in the second exhaust zone and is greater than or equal to the gas pressure in the second reactive zone. The gas pressure in the second reactive zone is also higher than the gas pressure in the second exhaust zone. This series of structural and pressure relationships minimizes cross-contamination of gases between the reactive zones.

DETAILED DESCRIPTION OF THE INVENTION

The present invention relates to an apparatus for use in CVD or ALD, using a rotary turntable susceptor. In the following description, the same numbers are used generally to refer to the same or similar parts.

Figure 1:
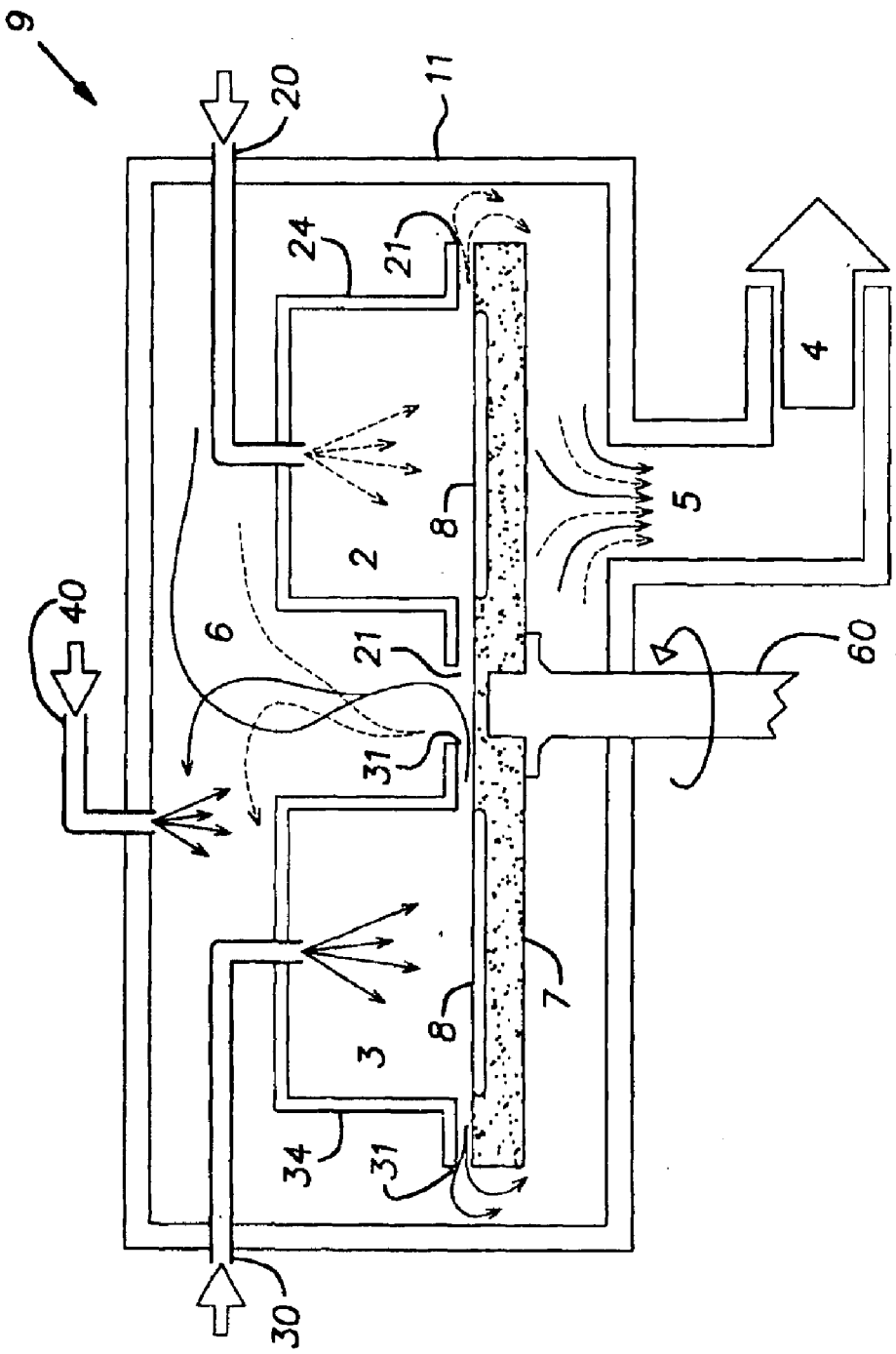
FIG. 1 is a cutaway side view of a prior art turntable CVD apparatus.
Figure 2:
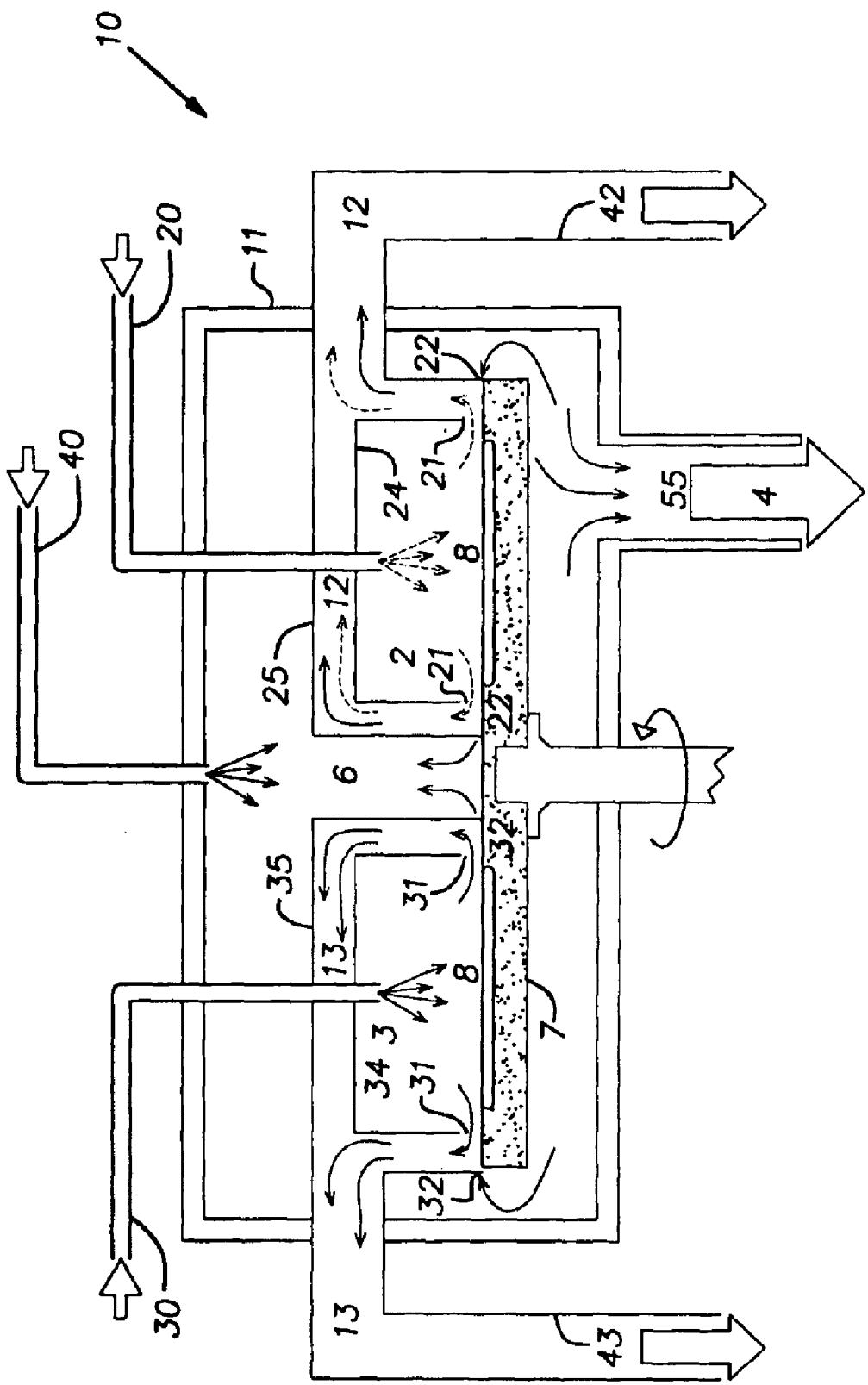
FIG. 2 is a cutaway side view of an embodiment of the CVD apparatus of the present invention.

The present invention is designed to avoid intermixing of non-compatible gases in any place close to the substrate environment. Referring to FIG. 2, the apparatus 9 has an outer enclosure 11. The outer enclosure contains reactive enclosures 24 and 34 having reactive zones 2 and 3 that are supplied by reactive gas inlet pipes 20 and 30 respectively. A neutral gas inlet 40 supplies a neutral flush gas to the buffer zone 6 in the outer enclosure. A pipe 55 leads to a pump 4. The substrates 8 rest on the susceptor, a rotary turntable 7. The reactive enclosures 24 and 34 are surrounded by ring-shaped channels 25 and 35 respectively. The ring-shaped channels 25 and 35 are connected to separate exhaust pipes 42 and 43 respectively.

In operation, the turntable carries the substrates alternately through the reactive zones 2 and 3. The gas pressure supplied to reactive zone 2 is higher than the gas pressure in exhaust zone 12, and the gas pressure supplied to reactive zone 3 is higher than the gas pressure in exhaust zone 13. Thus the reaction gas in reactive zone 2 escapes through conductance slits or gaps 21 into exhaust zone 12 in ring-shaped channel 25 and exhaust pipe 42. The reaction gas in reactive zone 3 similarly escapes through conductance slits or gaps 31 into exhaust zone 13 in ring-shaped channel 35 and exhaust pipe 43. The reaction gas in either or both of the reactive zones may be in the form of a plasma.

At the same time, the neutral gas pressure in the buffer zone 6 is higher than the gas pressure in the exhaust zones 12 and 13, so that neutral gas from the buffer zone 6 enters exhaust zones 12 and 13 through conductance slits or gaps 22 and 32 respectively. In addition, the pressure in the buffer zone 6 is greater than or equal to the pressure in the reactive zones 2 and 3. Preferably the pressure in the exhaust zone 12, while lower than the pressure in the reactive zone 2, will be greater than 90%, alternately 95% of the pressure in reaction zone 2; and the pressure in the exhaust zone 13, while lower than the pressure in the reactive zone 3, will be greater than 90%, alternately 95% of the pressure in the reactive zone 3.

The pressure differential between the buffer zone 6 and the exhaust and reaction zones ensures that an inward flow of neutral gas sweeps the periphery of the reactive zones and enters the exhaust zones. This inward flow opposes the diffusion of reactive gases into the buffer zone 6, thereby preventing the intermixing of non-compatible gases anywhere near the substrate environment. In the design, it is not important that the pressure differentials be great, as long as the foregoing pressure relationships are maintained. If the pressure difference between the reaction zones and the exhaust zones is small, then the relative system pressures can be effectively controlled by controlling the downstream pressure in the separate exhaust pipes.

Figure 3:
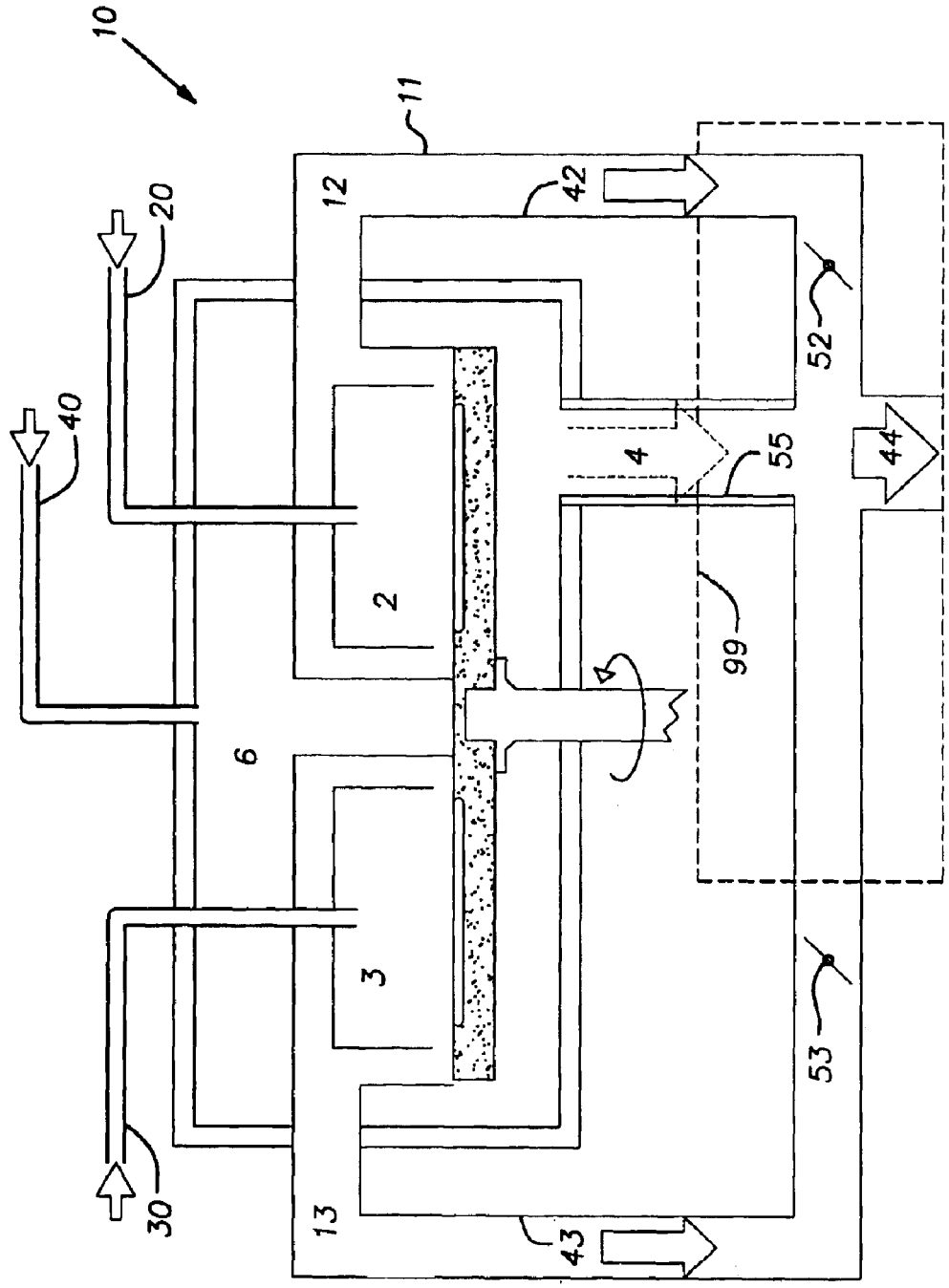
FIG. 3 is a cutaway side view of an embodiment of the CVD apparatus of the present invention.

The exhaust pipes 25, 35 and 55 may lead to separate pumps or vents. In the alternative, the pipes may join and meet before a common pump. While the use of separate pumps is safer in terms of avoiding gas interaction and in terms of dust management, it may also lead to excessive cost. FIG. 3 shows a configuration in which the exhaust pipes join together downstream before a common pump.

FIG. 3 shows a CVD apparatus according to the invention, in which the exhaust pipes meet downstream of the reactive and buffer zones but upstream of a common pump. If a design like that shown in FIG. 3 is used for the apparatus, then the exhaust pipes 42 and 43 should each run separately for a distance of at least about 0.5 m, and preferably for at least 1.0 m before joining together. Optional pressure regulation systems 52 and 53 are shown in the exhaust pipes 42 and 43. These can be used to provide different pressures between the exhaust zones 12 and 13, and thereby indirectly affect the pressures in the reaction zones 2 and 3. If the gas pressure in the reaction zones 2 and 3 can be equal to each other, then the pressure regulation systems would be largely unnecessary.

In FIG. 3, the exhaust pipe 55 is grayed out to show that it is an optional part. It is possible to channel all neutral gas and reaction gases out through the exhaust pipes 42 and 43. If the exhaust pipe 55 is present in this design, however, then to maintain a higher pressure in buffer zone than in the exhaust zones 12 and 13 a throttling means in the exhaust pipe 55 should be provided.

The dotted line 99 in FIG. 3 generally indicates the area where the reactive gases "a" and "b" from the reactive zones will meet and where dust will form. For this reason, it is desirable that the conduits in this area should be easily disassembled for periodic maintenance and cleaning.

During CVD or ALD the rotary susceptor will be heated to approximately the same temperature as the substrate, and so also will be coated with a deposition film. While this film may be removed by treatment with a gas such as $ClF_3$ or $F_2$ or a plasma such as $NF_3$, physical cleaning may be desirable to remove more difficult films such as $Ta_2O_5$, $Al_2O_3$, $ZrO_2$, etc. The apparatus may be designed with a large seal surrounding the periphery of the apparatus, allowing the system to be opened for access to the susceptor. Another option is to have a wide valve or side opening at the level of the susceptor, allowing the susceptor to slide out on a fork.

In time separated ALD the reactor temperature is often lower than the substrate temperature. The main reason is that the reactor walls would develop a coating as fast as the substrate does if they were maintained at the same temperature. The temperature of the reactor in time separated ALD is therefore usually maintained approximately 40°–60° C. lower than the susceptor temperature. This can lead to imprecision in the substrate temperature, as it tends to adopt an intermediate temperature between the susceptor temperature and the temperature of the reactor walls. In addition, factors such as wall emissivity, gas pressure and composition may affect the substrate temperature.

In a space separated ALD system, it is not necessary to lower the reactor wall temperature, at least as long as reactive gas cross contamination is avoided. For this reason, it is common to maintain the reactor wall temperature at or only slightly below the susceptor temperature. This maintains a more constant and controllable temperature of the substrate.

Maintaining an elevated reactor wall temperature also causes the system to degas faster, allowing faster elimination of contaminants at the beginning of an ALD cycle and reduced contamination.

For reasons of dust and particle management, however, the reactor walls are preferably maintained at a temperature 10°–20° C. lower than the substrate temperature. Thermophoresis pushes dust particles toward the coldest side of a gas gap, so this minor temperature differential will help ensure that any gas-borne dust will preferably go to upper part of the reactor rather than drifting onto the substrate. The upper wall of the reaction chamber should also be maintained at a temperature approximately 10°–30° C. below the susceptor temperature.

The manner of injecting the reactive gases "a" and "b" is also important. A substrate or wafer is exposed to a reactive chemical exposure zone during rotation. In one turn the substrate experiences at least two exposures, one with "a" and one with "b". It is possible to increase the deposition rate without increasing the rotation rate by having a larger number of exposure zones per rotation.

Figure 4:
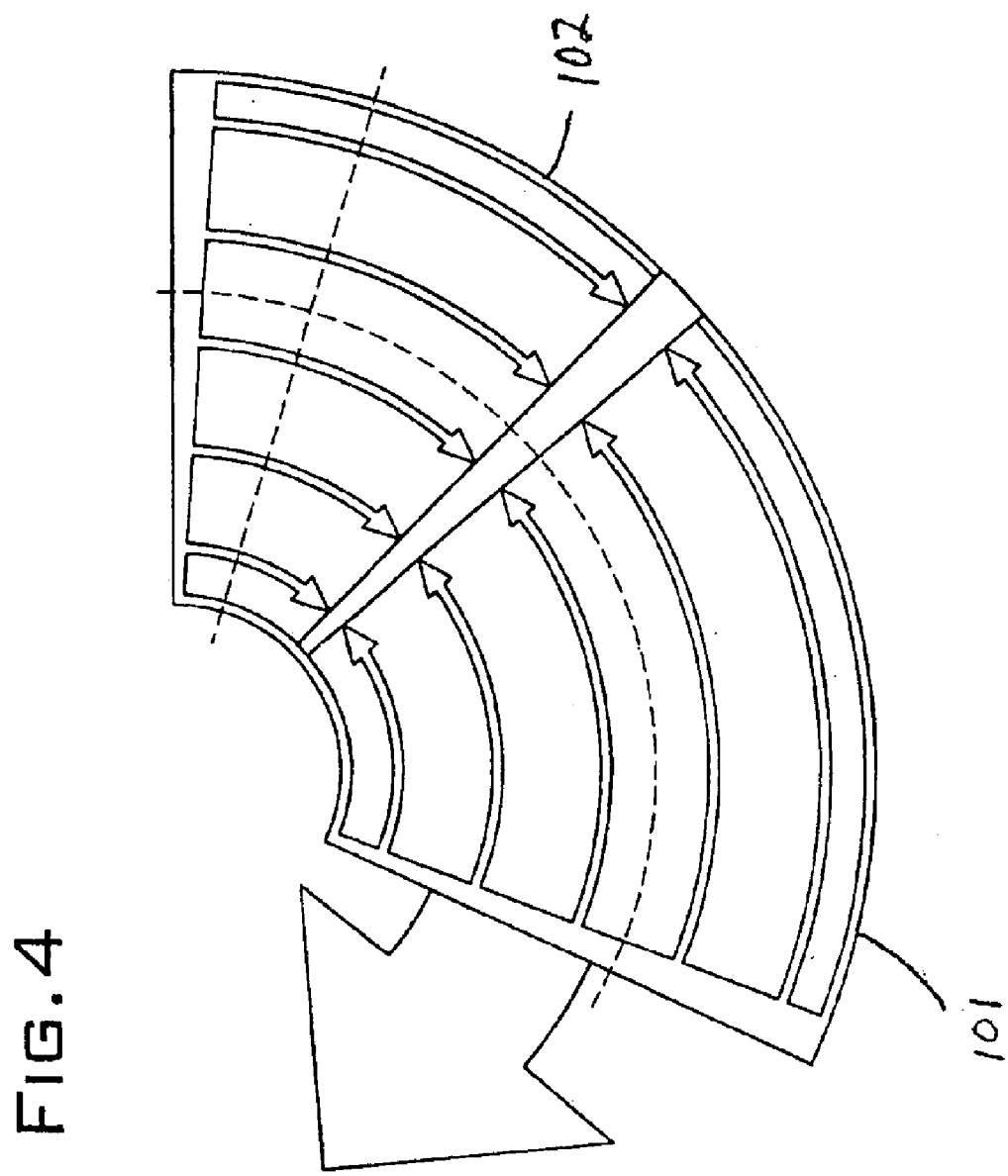
FIG. 4 is a schematic view plan view of a portion of the CVD apparatus of the present invention.

As shown schematically in FIG. 4, when multiple exposure zones 101, 102 are used in CVD generally with a rotary susceptor, each exposure zone 101, 102 should have the shape of a "pie segment". The objective of this segmentation is to ensure that all parts of the wafer spend the same time in the reactive zone. The time spent by any point of the wafer is the angular velocity of the susceptor divided by the angle of the pie segment of the corresponding zone. It is not necessary, however, that all segments have the same angle. If more time is needed for exposure to gas "a" than for exposure to gas "b", it may make sense to enlarge the angle of the zone for exposure of the substrate to "a".

For ALD, however, the time required to saturate the surface chemistry during a chemical exposure can also be adjusted by the concentration of reactant in the reaction zone. The reactive gases can therefore be diluted with a neutral gas differently in the various reaction zones if their exposure times will be of the same order.

Once the substrate has been exposed to "a", its surface becomes covered with molecules of "a" which are either chemisorbed or physisorbed. A degassing phase is desirable to remove most of the physisorbed molecules. This is the purpose of a "skimming zone". A skimming zone can be a "pie segment" or sector which the substrate passes through during the CVD process. In ALD the skimming process is as important as the exposure process. The "skimming" process can be considered as a "negative exposure" to "a" or "b". Like exposure in the reactive zones, skimming time should also be a process constant for all points along the radius of the "pie segment". During the skimming the substrate is subjected to a flow of neutral gas that flushes away the excess and physisorbed "a" molecules. The degassing time required is a function of temperature and chemistry of the wall and gas constituents.

The reactive gas should be delivered to a reactive zone pie segment and pumped out of the reactive zone into the ring-shaped channel. Because gas diffusion in the direction parallel to the turntable radius (toward the outer edge of the pie segment) is limited, it is necessary to provide a greater degree of gas delivery toward the outer edge of the segment. Thus the gas delivery should be delivered with a local inflow increasing proportionally to the radial distance from the turntable axis. Each of the pie segment process zones will be referred to hereinafter as either reactive zones (which contain gasses "a" or "b") or skimming zones (which contain neutral gas).

One way to achieve radially increasing gas delivery is to flow in the gas using a uniform showerhead covering the entire pie segment. The width of the segment increases proportionally to the radius, leading to proportional increase of showerhead area and thus gas delivery. This method, however, can create gas eddies or vortices, which can affect the integrity of the CVD process. The moving turntable provides a boundary condition for the gas flow dynamic which creates this risk of eddy. Eddies may create long residence time pockets for gas. If the turn table at any point moves far faster than the local average gas velocity, then there is a risk for vortex and a stagnation point to form in the gas flow pattern. The risk associated with a stagnation point is the build up of dust in the gas phase. The risk can be reduced by taking a number of measures, including 1) using very pure process gases, 2) carefully avoiding mutual contamination of gas "a" by gas "b" and vice versa, 3) having an upward thermophoresis in the system, and 4) making regular maintenance in the system. If these conditions are all optimized, then some degree of eddy in the gas flow pattern can be tolerated.

Figure 5:
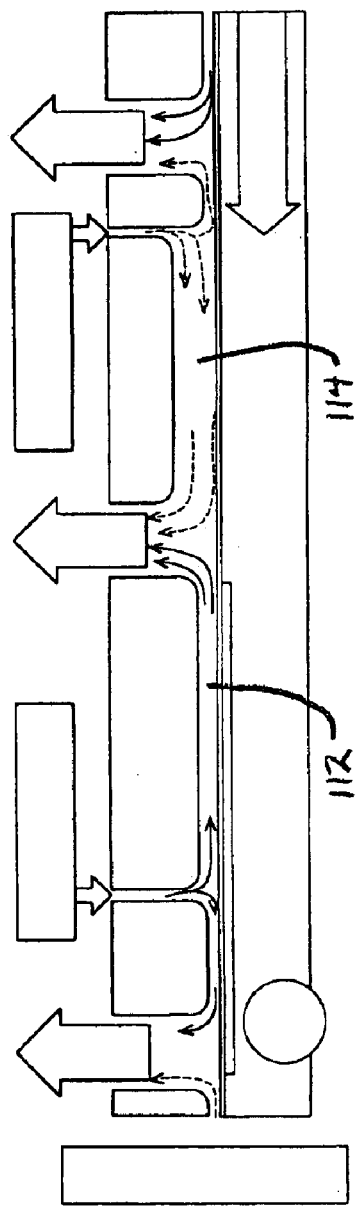
FIG. 5 is a schematic side view of a portion of the CVD apparatus of the present invention.

As shown schematically in FIG. 4 and FIG. 5, an advantageous design for delivering gas without eddy is to deliver the gas along a radial line at or near the edge of the pie segment where the substrate enters, with increasing gas flow toward the periphery of the pie segment. This is shown in pie segment 102 of FIG. 4 and process zone 114 of FIG. 5. In FIG. 4 the increasing gas flow toward the periphery of the pie segment is indicated by increasing length of arrows representing the gas flow. The reactive gas then flows parallel to the motion of the substrate within the pie segment. Because the gap or conductance slit leading to the ring-shaped channel is narrow in width, the majority of the gas flows along with the motion of the turntable, rather than out of the reactive zone.

To minimize eddy using such a gas delivery method, it is desirable that the average gas velocity should be at least about 35% of the substrate local velocity. To ensure smooth flow of the gas, it is desirable that the substrate is placed in an insert in the turntable in such a way that the horizontal surfaces are well aligned, preferably to an accuracy of +/−0.2 mm, ideally +/−0.1 mm.

When degassing, it is necessary that the time spent by the substrate in the skimming zone is significantly larger than the time necessary for the physisorbed species present on the substrate to degas. This time is defined essentially by chemistry and by the process temperature. For a given ALD process the temperature will have to be raised until the necessary time is reached. For a turntable rotation of 60 rpm, the substrate typically stays in a skimming zone for about 10 ms. Hence, the natural degassing time should be less than a few milliseconds. It is also required that the skimming neutral gas evacuates the reactive molecules before they have a chance to adsorb to the surface again. For this purpose a counterstream design is better than a situation where both the neutral "rinsing" gas and the substrate move in the same direction. This is the case, despite the fact that counterstream flow of the gas may lead to some vortex formation, since the limit gas layer very near the substrate is moving with the substrate while the main gas stream flows in the opposite direction. As shown schematically in FIG. 4 in segment 101 and in FIG. 5 in skimming zone 112, in a counterstream design the gas is injected into the skimming zone at or near the edge of the pie segment furthest from the edge where the substrate enters the skimming zone.

Figure 6:
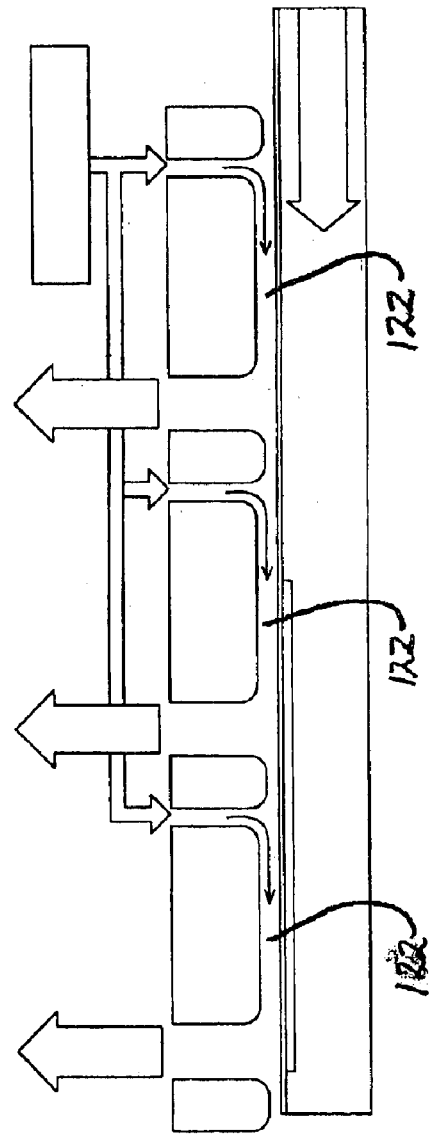
FIG. 6 is a schematic side view of a portion of the CVD apparatus of the present invention.

If vortex formation leads to significant particle contamination, an alternative skimming zone design may be used. As shown schematically in FIG. 6, the skimming zone is made up of a number of subsections, each having a pair of gas injection and evacuation channels, each having a gas flow parallel to the substrate motion. This design avoids stagnation points by reducing vortex formation, but comes at the expense of a more complex design. In this design, all degassed molecules emitted by the substrate move with the gas, and use of only one skimming zone segment would result in inadequate degassing. For this reason, it is preferred to extract the degas component in a skimming zone having either a single counterstream segment, or having a plurality of segments utilizing gas flow in the same direction as the rotation of the turntable.

It may be advantageous to include measurement means in the apparatus to monitor a substrate property, such as alignment or thickness of the deposited film. The measurement means may communicate with a control means in a known way to adjust a process parameter in response to output of the measurement means.

Although the preferred embodiments of the invention have been shown and described, it should be understood that various modifications and changes may be resorted to without departing from the scope of the invention as disclosed and claimed herein.

What is claimed is:

1. A method of depositing an Atomic Layer Deposition film on a substrate, comprising the steps of
   (a) passing the substrate through a first enclosure defining a first reactive zone, the first reactive zone containing a first reactive gas at a first, reactive zone pressure, the first reactive zone being in fluid communication with a first exhaust zone, the first exhaust zone further being in communication with a buffer zone defined by an outer enclosure, the outer volume containing a neutral gas at a second, buffer zone pressure, the total pressure of gas in the first exhaust zone being a third, exhaust zone pressure, the first, reactive zone pressure being greater than the third, exhaust zone pressure, the second, buffer zone pressure being greater than the third, exhaust zone pressure and the second, buffer zone pressure being greater than or equal to the first, reactive zone pressure, and
   (b) passing the substrate through a second enclosure defining a second reactive zone, the second reactive zone containing a second reactive gas at a fourth, reactive zone pressure, the second reactive zone being in fluid communication with a second exhaust zone, the second exhaust zone further being in communication with the buffer zone defined by the outer enclosure, the total pressure of gas in the second exhaust zone being a fifth, exhaust zone pressure, the fourth, reactive zone pressure being greater than the fifth, exhaust zone pressure, the second, buffer zone pressure being greater than the fifth, exhaust zone pressure, and the second, buffer zone pressure being greater than or equal to the fourth, reactive zone pressure.

2. The method of claim 1, wherein the substrate is placed on a movable susceptor, the susceptor carrying the substrate as it passes through the reactive zones.

3. The method of claim 2, wherein the susceptor rotates on an axis at a constant angular speed at least during passing of a substrate through a reactive zone.

4. The method of claim 3, wherein one of the reactive gases is injected into one of the reactive zones in a distributed manner along the susceptor's radius of rotation.

5. The method of claim 4, wherein the reactive gas is injected into the reactive zone at each injection point at a rate proportional to the length of the radius measured to the injection point.

6. The method of claim 4, wherein the reactive gas is injected so as to flow in contact with the susceptor and in the direction of the susceptor's rotation.

7. The method of claim 6, wherein the local average parallel velocity of the reactive gas flow in contact with the susceptor is at least 35% of the local substrate velocity.

8. The method of claim 6, wherein step (a) and step (b) are repeated alternately, and wherein a step of passing the substrate through a skimming zone is performed between each performance of each step (a) and each step (b).

9. The method of claim 8, wherein after a first layer of ALD film has been formed on the substrate, process conditions are changed so as to form a different layer of ALD film on the substrate.

10. The method of claim 1, wherein at least one reactive zone and its attached pumping zone is heated above room temperature.

11. The method of claim 10, wherein the reactive zone and its attached exhaust zone are kept at a temperature below the substrate temperature, the difference between 1) the substrate temperature and 2) the temperature of the reactive zone and attached exhaust zone being no more than 50° C.

12. The method of claim 1, wherein the third, exhaust zone pressure is at least 90% of the first, exhaust zone pressure, and the fifth, exhaust zone pressure is at least 90% of the fourth, reactive zone pressure.

13. The method of claim 1, wherein the third, exhaust zone pressure is at least 95% of the first, exhaust zone pressure, and the fifth, exhaust zone pressure is at least 95% of the fourth, reactive zone pressure.

14. The method of claim 1, wherein the first exhaust zone is defined by a first exhaust pipe and the second exhaust zone is defined by a second exhaust pipe, and at least one of the first and second exhaust pipes extends at least 0.5 meters along the gas flow axis.

15. The method of claim 14, wherein at least in one of the exhaust pipes that join before a common pump, a pressure regulation system ensures a process pressure higher in the corresponding reactive zone than the pressure in the other reactive zone.

16. The method of claim 1, wherein the exhaust zones are connected to independent exhaust pipes leading to independent pumps, the third and fifth exhaust pressure values being kept independent.

17. The method of claim 1, further comprising the step of passing the substrate through a skimming zone where a neutral gas is flown after passing the substrate through one of the reactive zones.

18. The method of claim 17, wherein a sequence of step (a) and step (b) is repeated and wherein the step of passing the substrate through a skimming zone is performed between each performance of the sequence.

19. The method according to claim 1, wherein at least one of reactive gases is excited by a plasma.

20. The method according to claim 1 wherein at least one of the reactive zones is exposing the substrate to activating agents such as radicals, excited atoms or molecules, photons, electrons or ions.

21. The method according to claim 1, wherein a measurement means is used to monitor a substrate property.

22. The method according to claim 21, wherein a control means automatically adjusts a process parameter in response to output of the measurement means.

23. The method of claim 1 wherein at least one of the exhaust zones is disposed as an annulus fully surrounding its process zone.

* * * * *